United States Patent
Hsieh et al.

(10) Patent No.: US 8,882,290 B2
(45) Date of Patent: Nov. 11, 2014

(54) LIGHT-MIXING TYPE LIGHT-EMITTING APPARATUS

(75) Inventors: Min-Hsun Hsieh, Hsinchu (TW);
Chia-Liang Hsu, Hsinchu (TW);
Chien-Fu Huang, Hsinchu (TW);
Chih-Chiang Lu, Hsinchu (TW);
Chun-Yi Wu, Hsinchu (TW)

(73) Assignee: Epistar Corporation (TW)

( * ) Notice: Subject to any disclaimer, the term of this patent is extended or adjusted under 35 U.S.C. 154(b) by 1013 days.

(21) Appl. No.: 11/798,521

(22) Filed: May 15, 2007

(65) Prior Publication Data

US 2007/0263384 A1    Nov. 15, 2007

(30) Foreign Application Priority Data

May 15, 2006  (TW) .............................. 95117359 A

(51) Int. Cl.
*F21K 2/00*     (2006.01)
*H01L 25/075*   (2006.01)
*F21K 99/00*    (2010.01)

(52) U.S. Cl.
CPC ... *H01L 25/0753* (2013.01); *H01L 2224/49107* (2013.01); *H01L 2224/48137* (2013.01); *F21K 9/00* (2013.01); *H01L 2224/48091* (2013.01); *H01L 2224/73265* (2013.01)
USPC ............................ 362/231; 362/555; 362/560

(58) Field of Classification Search
USPC .................................. 362/231, 555, 560, 373
See application file for complete search history.

(56) References Cited

U.S. PATENT DOCUMENTS

| | | | | |
|---|---|---|---|---|
| 3,746,853 A * | 7/1973 | Kosman et al. | ............... | 362/301 |
| 3,899,826 A * | 8/1975 | Russ | ............................... | 438/28 |
| 4,783,368 A * | 11/1988 | Yamamoto et al. | ........... | 428/408 |
| 5,583,350 A * | 12/1996 | Norman et al. | ................. | 257/88 |
| 6,455,878 B1 * | 9/2002 | Bhat et al. | ........................ | 257/99 |
| 6,563,139 B2 * | 5/2003 | Hen | ................. | 257/89 |
| 6,697,130 B2 * | 2/2004 | Weindorf et al. | ............... | 349/65 |
| 6,903,381 B2 * | 6/2005 | Lin et al. | .......................... | 257/99 |
| 7,140,751 B2 * | 11/2006 | Lin | .......................... | 362/249.02 |
| 7,213,942 B2 * | 5/2007 | Jiang et al. | ..................... | 362/231 |
| 7,497,596 B2 * | 3/2009 | Ge | ................................. | 362/294 |
| 7,511,311 B2 * | 3/2009 | Kususe et al. | .................... | 257/95 |
| 7,556,415 B2 * | 7/2009 | Hamada et al. | ................ | 362/612 |
| 2001/0003304 A1 * | 6/2001 | Azar | ............................ | 165/80.3 |
| 2005/0184305 A1 * | 8/2005 | Ueda | ............................. | 257/99 |
| 2006/0164836 A1 * | 7/2006 | Suehiro et al. | ................ | 362/294 |

FOREIGN PATENT DOCUMENTS

| | | |
|---|---|---|
| TW | 344900 | 6/1997 |
| TW | I239108 | 1/2004 |
| TW | I244535 | 3/2004 |

* cited by examiner

*Primary Examiner* — Sharon Payne
(74) *Attorney, Agent, or Firm* — Bacon & Thomas, PLLC

(57) ABSTRACT

A light-mixing type light-emitting apparatus comprises a plurality of light-emitting diodes (LEDs) formed on a transparent carrier, wherein each of the LEDs with a transparent substrate emits light of a distinct color when driven, and the light beams generated from the LEDs are mixed to form a specific color. The transparent carrier setting forth in the present invention provides a mixing zone underlying the plurality of LEDs for the light beams to mix uniformly so as to improve the light-mixing efficiency of the light-emitting apparatus and shorten the mixing distance.

44 Claims, 10 Drawing Sheets

LIGHT-MIXING TYPE LIGHT-EMITTING APPARATUS

REFERENCE TO RELATED APPLICATION

The present application claims the right of priority based on Taiwan Application Serial Number 095117359, filed on May 15, 2006, the disclosure of which is incorporated herein by reference in its entirety.

TECHNICAL FIELD

This invention relates to a light-emitting apparatus and more particularly to a light-mixing type light-emitting apparatus.

BACKGROUND

As the luminous efficiency of the light-emitting diode (LED) has been increasing, the extent of the LED applications has become broader and broader, ranging from the traditional indication, lighting sources to various sorts of backlight sources, such as portable flashlights, backlights of mobile phones or liquid crystal displays (LCDs).

Many researches have been widely involved in the development of white light LEDs as LCD backlight sources in order to replace cold cathode fluorescent lamps (CCFL) that have been traditionally used as light sources. One of the related methods is to uniformly mix the light emitted respectively by the red, green, blue LEDs, which are disposed properly, and thereby to produce white light. FIG. 1 shows the light-emitting device disclosed by West et al. in U.S. Pat. No. 6,974,229, capable of improving the light-mixing efficiency of the neighboring red, green, and blue LEDs. The light-emitting device 10 comprises an optical lens 12, and the form of the optical lens 12 is customized so as to redirect light to the lateral regions 13 for enhancing the light extraction efficiency in horizontal directions such that the light-mixing efficiency with neighboring LEDs is improved. FIG. 2 shows the light-emitting device disclosed by Park et al. in US2006/0001034 for improving light-mixing efficiency. A light-emitting device 20 comprises a red, green, and blue LED, a resin 24 encapsulating the LEDs, and light-mixing materials 23 dispersed uniformly within the resin 24. The light-mixing materials 23 are served to scatter light emitted from the LEDs randomly such that the light-mixing efficiency with neighboring LEDs can be improved.

The above-mentioned methods emphasize on providing a light-mixing mechanism upon the LEDs for reducing the light-mixing distance. However, the design of a customized optical lens or the fabrication process including encapsulating the light-mixing materials with a resin is complicated. Besides, the cost is increased as well.

SUMMARY OF THE INVENTION

It is therefore an aspect of the present invention to provide a light-mixing type light-emitting apparatus. The light-emitting apparatus comprises a transparent carrier and a plurality of LEDs. Each of the plurality of LEDs, having a transparent substrate, is formed on the transparent carrier and emits light of a distinct color when driven. The transparent carrier provides a light-mixing zone underlying the plurality of LEDs for the light beams emitted from the plurality of LEDs to mix uniformly so as to improve the light-mixing efficiency of the light-emitting apparatus and shorten the mixing distance.

Another aspect of the invention is to provide a light-mixing type light-emitting apparatus comprising a transparent carrier and a plurality of LEDs, wherein each of the plurality of LEDs emits light of a distinct color and the light beams emitted from the plurality of LEDs are mixed into a specific color.

Another aspect of the invention is to provide a light-mixing type light-emitting apparatus comprising a transparent carrier, and at least two different sorts of LEDs, selected from the group consisting of red, blue, green, and yellow LEDs, formed thereon. The light beams emitted from the two different sorts of LEDs are mixed into light of a predetermined color, wherein the light of the predetermined color comprises white light.

Another aspect of the invention is to provide a light-emitting apparatus of high light-mixing efficiency applicable to a high voltage electrical apparatus. The light-emitting apparatus comprises a transparent carrier and a plurality of LEDs, wherein each of the LEDs formed on the transparent carrier emits light of a distinct color, and wherein at least two of the LEDs are serially connected for a high voltage application.

Another aspect of the invention is to provide a light-emitting apparatus further comprising a submount for use in a direct-type backlight source of a flat display apparatus.

DETAILED DESCRIPTION OF THE PREFERRED EMBODIMENTS

Figure 1:
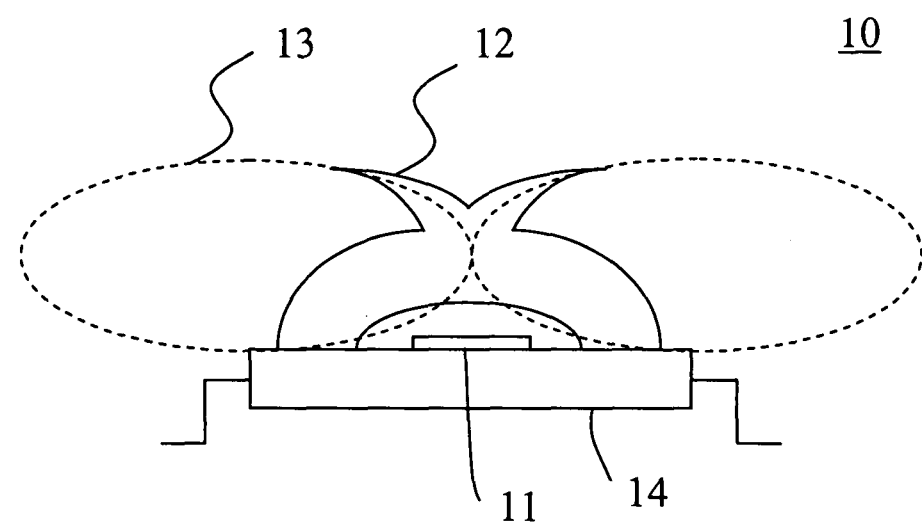
FIG. 1 shows a light-emitting apparatus comprising an optical lens in accordance with the prior art.
Figure 2:
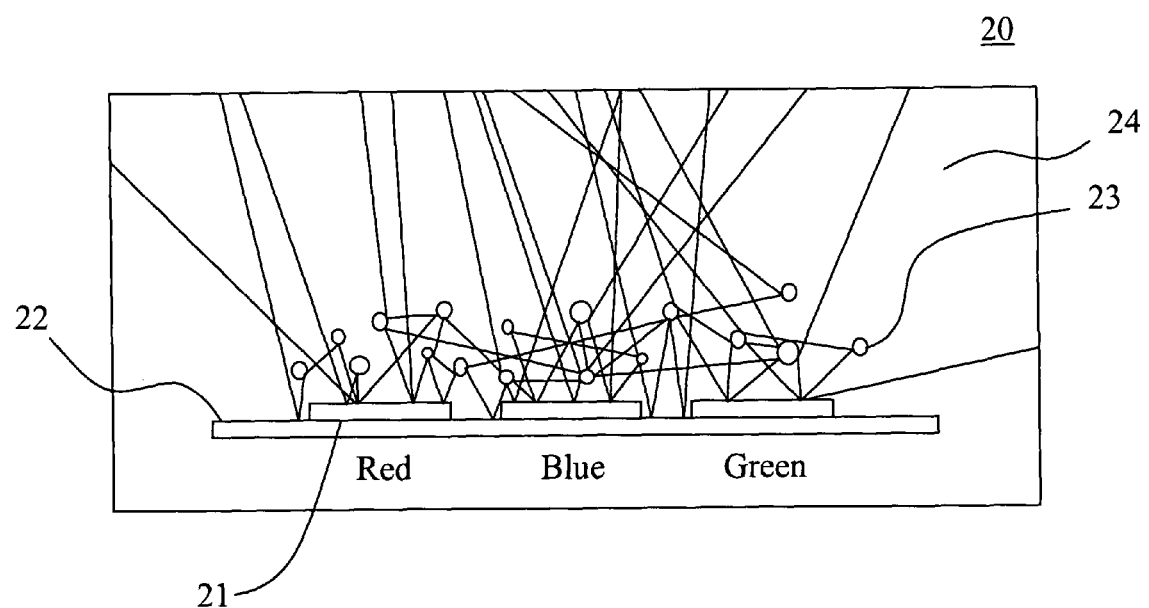
FIG. 2 shows a light-emitting apparatus comprising light-mixing materials in accordance with the prior art.
Figure 3A:
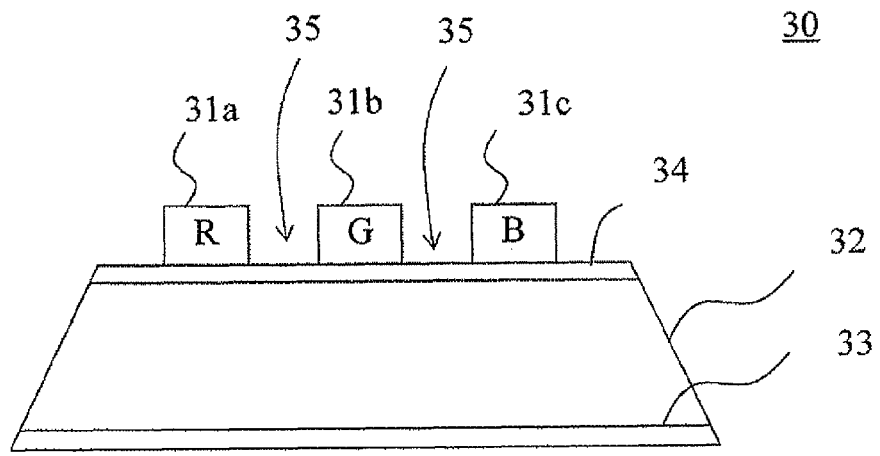
FIG. 3a shows an embodiment of a light-emitting apparatus in accordance with the present invention.

FIG. 3a shows one embodiment of a light-mixing type light-emitting apparatus in accordance with the present invention. A light-mixing type light-emitting apparatus 30 comprises a transparent carrier 32, a transparent adhesive layer 34 formed on the upper surface of the transparent carrier 32, and a red LED 31a, a green LED 31b, and a blue LED 31c attached to the transparent carrier 32 through the transparent adhesive layer 34. Trenches 35 are located between the LED's as shown in FIG. 3a. The transparent adhesive layer 34 comprises at least one material selected from the group consisting of Polyimide (PI), Benzocyclobutene (BCB), Perfluorocyclobutane (BFCB), Epoxy resin, and Silicone. The transparent carrier 32 provides a light-mixing zone underlying the LEDs 31a~31c for the light beams emitted from the LEDs 31a~31c to mix uniformly into white light within the transparent carrier 32. The light-emitting apparatus 30 further comprises a reflecting layer 33 formed on the lower surface of the transparent carrier 32 for reflecting light beams back into the transparent carrier 32 such that the light-mixing efficiency is enhanced. The reflecting layer 33 is selected from the group consisting of Sn, Al, Au, Pt, Ag, Ti, Cu, PbSn, AuZn, $SiO_2$, $Al_2O_3$, $SiN_x$, and $TiO_2$. The transparent carrier 32 is selected from the group consisting of $Al_2O_3$, glass, GaP, SiC, and CVD diamond. In one preferred embodiment, the transparent carrier 32 has good thermal conductivity, such as $Al_2O_3$, or CVD diamond, for enhancing the heat dissipation and the product reliability of the light-emitting apparatus.

Figure 3B:
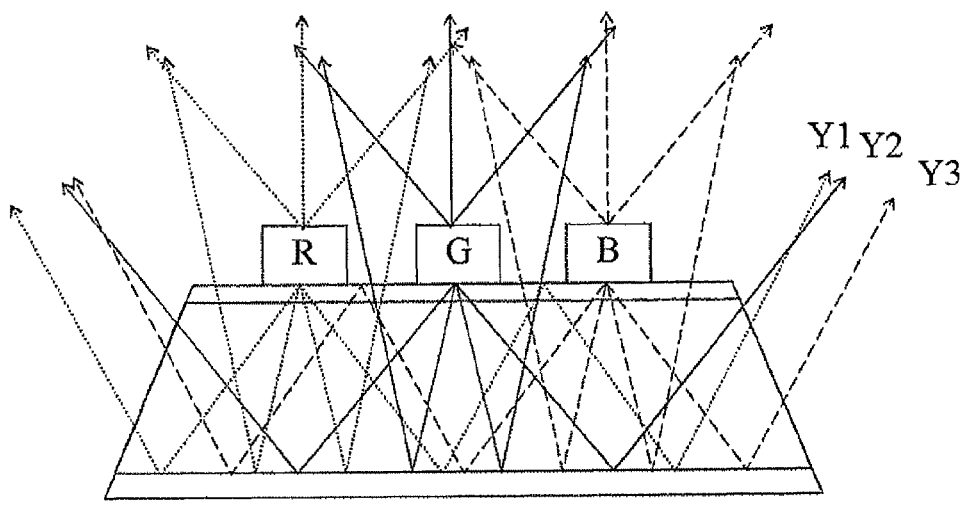
FIG. 3b exemplifies the traces of the light beams transmitting within the transparent carrier of the light-emitting apparatus.

FIG. 3b shows the traces of the light beams in accordance with the light-emitting apparatus of FIG. 3a. A portion of the light beams emitted by the red (R), green (G), and blue (B) LEDs transmit downward into the transparent carrier and exit the transparent carrier omnidirectionally after being reflected repeatedly within the transparent carrier. Consequently, the red, green, and blue light beams are uniformly mixed into white light through the transparent carrier. For example, light beams Y1, Y2, and Y3 as indicated in FIG. 3b, representing for the light beams emitted by the red (R), green (G), and blue (B) LEDs correspondently, are reflected repeatedly and transmitted out of the right side of the transparent carrier afterward. In one embodiment, the form of the two sides of the transparent carrier can be ramp, curve, or ladder shape to further enhance light extraction efficiency of the apparatus. The present invention is effective to shorten the light-mixing distance by providing a light-mixing zone underlying the LEDs. It is thereby advantageous to increase the effective display area while implementing the invention in an edge-type backlight source of a flat display apparatus, and to downsize the total thickness of a flat display apparatus while implementing in a direct-type backlight source.

Figure 4A:
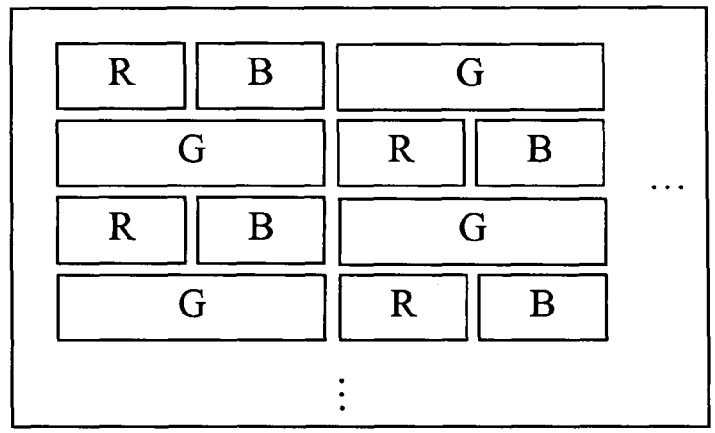
FIGS. 4a~4c show layouts of the LEDs on the transparent carrier in accordance with the present invention.
Figure 4B:
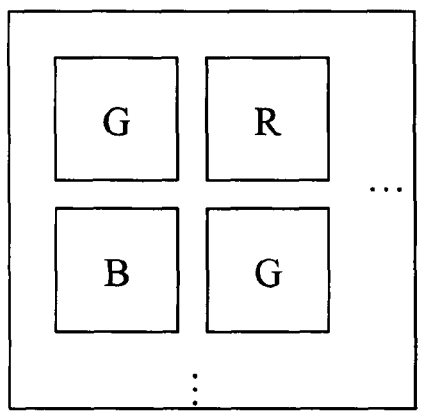
Figure 4C:
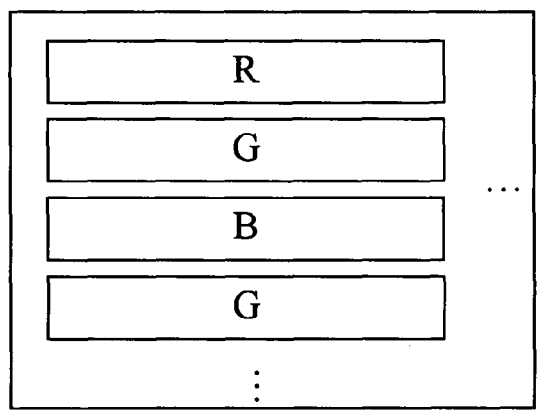

FIGS. 4a~4c show various embodiments of layout of a plurality of red, green, and blue LEDs arranged on the transparent carrier for achieving better light-mixing efficiency. As shown in FIG. 4a, red, green, and green LEDs are substantially in interlaced arrangement, and the total occupation area of the green LEDs is about double of that of the red or blue LEDs. FIG. 4b shows that the total dice number of the green LEDs is about double of that of the red or blue LEDs while each of the single die area of the red, green, and blue LEDs is substantially equal. FIG. 4c shows that the form of the LEDs is a stripe for facilitating fabrication. Moreover, it is also preferred to adjust the thickness of the transparent carrier and the in-between space of the neighboring LEDs to enhance the light-mixing efficiency.

Figure 5:
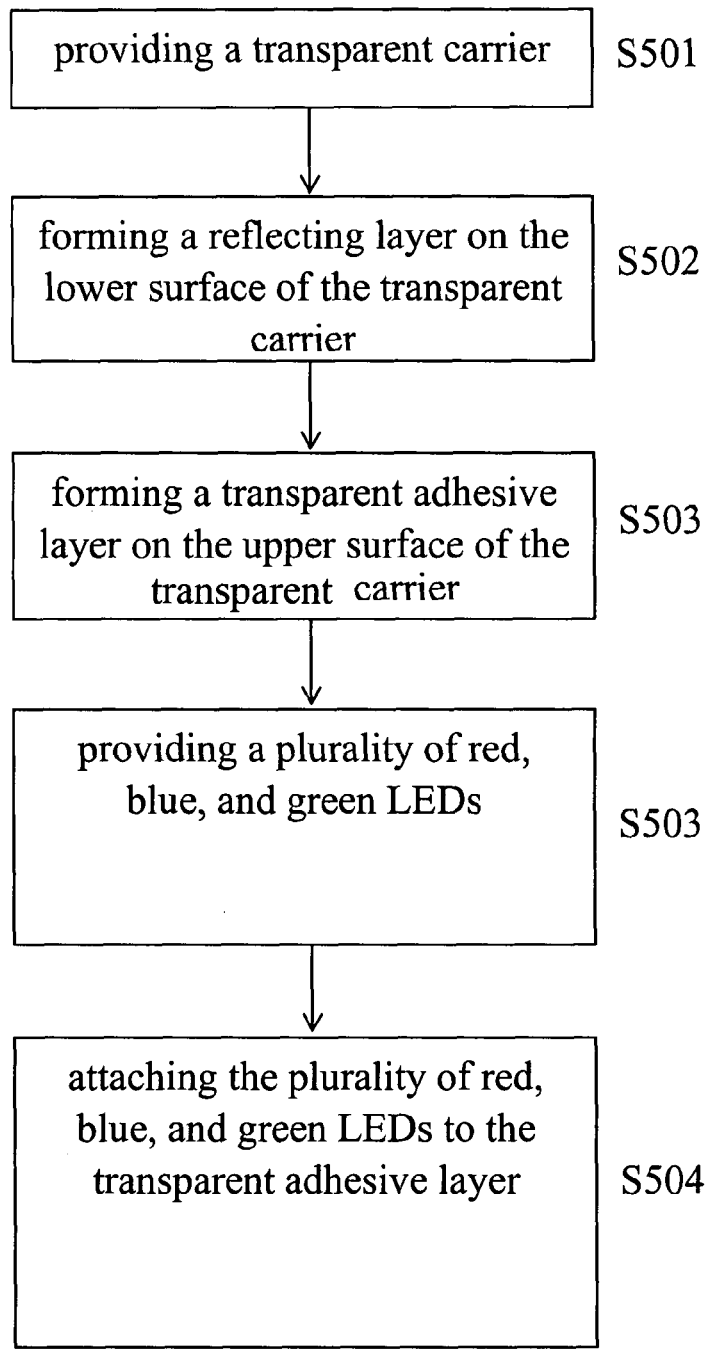
FIG. 5 illustrates the steps for manufacturing the light-emitting apparatus the present invention.

FIG. 5 demonstrates the fabrication method in accordance with the present invention. The fabricating steps comprise:

S501: providing a transparent carrier;
S502: forming a reflecting layer on the lower surface of the transparent carrier;
S503: forming a transparent adhesive layer on the upper surface of the transparent carrier. The transparent adhesive layer can be formed by spin-coating an adhesive material on the transparent carrier or by other methods known to those skilled in the art;
S504: providing a plurality of red, blue, and green LEDs, wherein the plurality of LEDs are formed by prefabricating the LED structure on a growth wafer and then dicing the wafer into small dies; and
S505: attaching the plurality of red, blue, and green LEDs to the transparent carrier through the transparent adhesive layer.

Figure 6:
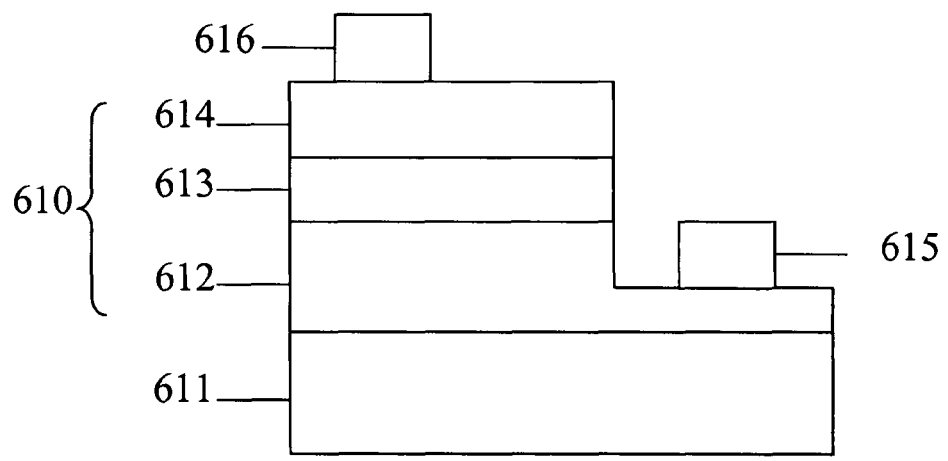
FIG. 6 shows a structure of an LED in accordance with one embodiment of the present invention.

FIG. 6 shows one embodiment of the LED structure applicable to the present invention. LED 61 comprises a transparent substrate 611, a light-emitting stack layer 610 formed on the transparent substrate 611, a first electrode 615 and a second electrode 616 electrically coupled to the light-emitting stack layer 610. The transparent substrate 611 is selected from the group consisting of $Al_2O_3$, glass, GaP, SiC, and CVD diamond. The light-emitting stack layer 610 is formed on the transparent substrate 611 for emitting light when driven. The color of the light beam emitted from the light-emitting stack layer 610 depends on the materials of the light-emitting stack layer. For example, $(Al_pGa_{1-p})_qIn_{(1-p)}P$ series, dependent on p, q values, can emit red, yellow, or green light; and $Al_xIn_y Ga_{(1-x-y)}N$ series, dependent on x, y values, can emit blue or violet light. The light emitting-stack layer 610 further comprises a first semiconductor layer 612 of first electricity, a second semiconductor layer 614 of second electricity, and an active layer 613 interposed between the first semiconductor layer 612 and the second semiconductor layer 614. The first electricity is n-type of p-type, and the second electricity is different from the first electricity. The active layer 613 comprises a double heterojunction (DH) structure or a multi-quantum well (MQW) structure for enhancing the internal quantum efficiency. The first electrode 615 and the second electrode 616 are electrically coupled to the first semiconductor layer 612 and the second semiconductor layer 613 respectively for connecting to a power source through wires. Although the first electrode 615 and the second electrode 616 are on the same side with respect to the transparent substrate 611, it is conceivable for those skilled in the art to modify and implement with vertical-type LED in light of the current invention.

Figure 7A:
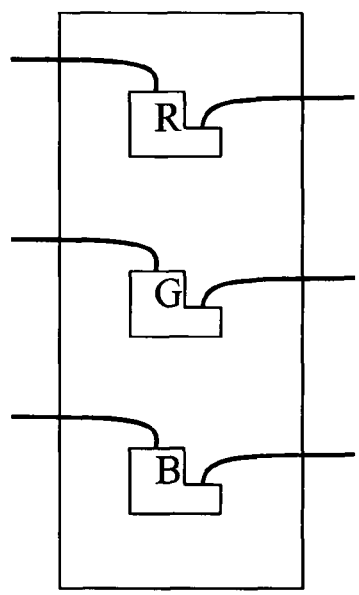
FIGS. 7a and 7b illustrate embodiments of the electrical connections of the LEDs in accordance with the present invention.
Figure 7B:
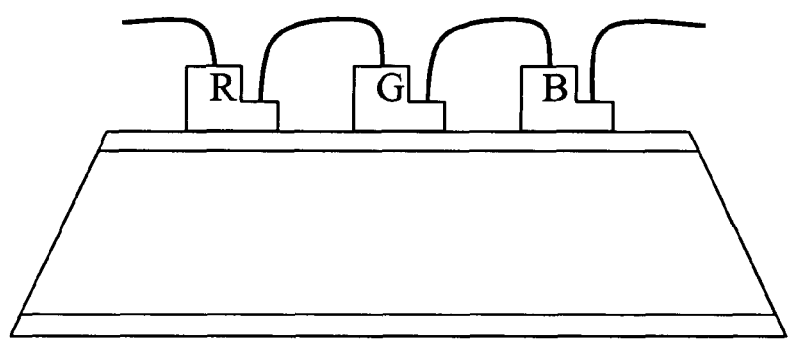

FIGS. 7a and 7b show embodiments of the electrical connection of the plurality of LEDs depicted in FIG. 3a. The red, green, and blue LEDs are connected in a parallel manner to the DC voltage sources (not shown) respectively, as shown in FIG. 7a, for driving the LEDs under the corresponding bias voltages V1, V2, and V3. It is therefore achievable to fine-tune the corresponding bias voltages V1, V2, and V3 independently to optimize the luminous characteristics and the light-mixing efficiency. V1, V2, and V3 can be the same or distinct values. FIG. 7b shows that the red, green, and blue LEDs are serially connected for high-voltage applications, such as DC (Direct Current) source (6~100 Volts) or AC (Alternating Current) source (such as 110 or 220 volts).

Figure 8A:
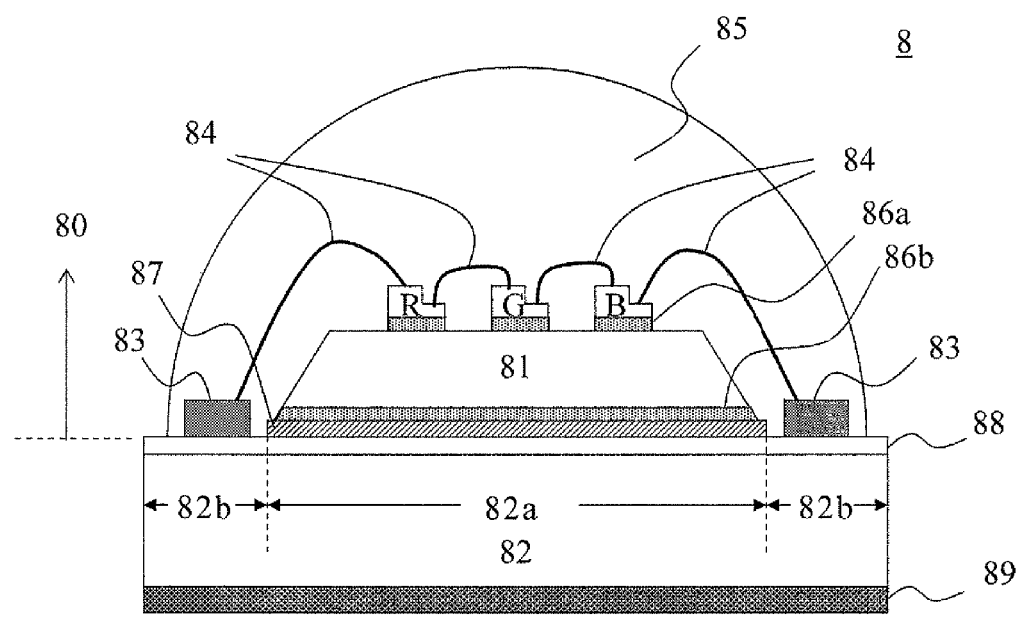
FIGS. 8a~8c illustrate embodiments of the light-emitting apparatus comprising a submount in accordance with the present invention.

FIG. 8a shows one embodiment of a light-emitting apparatus comprising a submount in accordance with the present invention. A light-emitting apparatus 8 comprises a light-emitting element 80 and a submount 82 underlying the light-emitting element 80. The light-emitting element 80 comprises a transparent carrier 81 formed on a first portion 82a of the submount 82, and a red LED (R), a green LED (O), and a blue LED (B) formed on the transparent carrier 81, bonding pads 83 formed on a second portion 82b of the submount 82 for electrically coupling the LEDs to a power supply (not shown) through wires 84, and a resin 85 encapsulating the LEDs, the transparent carrier 81, the bonding pads 83, and the wires 84. The R, G, B LEDs are serially connected through wires 84 and attached to the transparent carrier 81 through a first transparent adhesive layer 86a. The LEDs can also be connected in a parallel manner as depicted in FIG. 7a. The transparent carrier 81 is further attached to the submount 82 through a second transparent adhesive layer 86b. The submount 82 is selected from the group consisting of Si, $Al_2O_3$, glass, GaP, SiC. Besides, the submount 82 can be made to be flexible or made of intrinsic flexible materials for conforming to the lighting or ornament application with particular shapes.

Figure 8B:
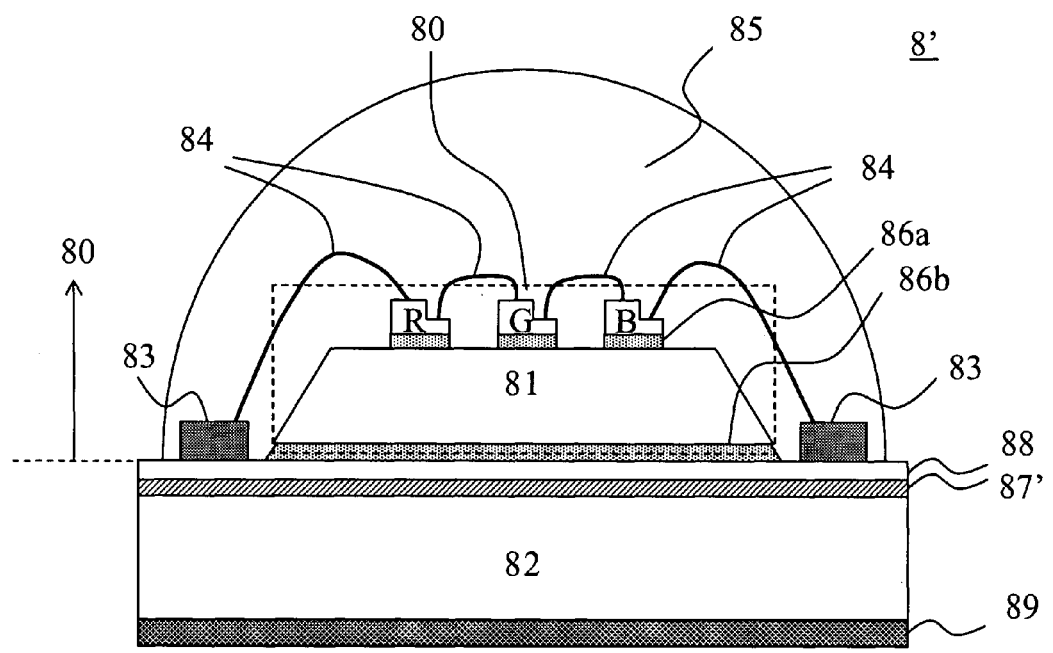

The light-emitting apparatus 8 further comprises a reflecting layer 87 formed on the submount 82 and apart from the bonding pads 83 for reflecting light back to the transparent carrier 81. An insulating layer 88, such as $SiN_x$ or $SiO_2$, is preferred to interpose between the bonding pads 83 and the submount 82 for electrically isolating the bonding pads 83 and the submount 82 in case the submount is made of conducting materials. The reflecting layer 87 comprises metal, metal oxide, DBR (Distributed Bragg Reflector), or the combination thereof. The light-emitting apparatus 8 further comprises a heat dispersion layer 89 formed on the lower surface of the submount 82 for conducting heat generated from the light-emitting element 80 to the surroundings. The heat dispersion layer 89 comprises materials having thermal conductivity greater than 50 [K/m·T], such as DLC (diamond-like carbon), SiC, or GaN. In order to get a promoted heat dissipation performance, as exemplified, the submount or the heat dispersion layer has a textured or roughened surface to enlarge the heat exchange area with the surroundings. An alternative embodiment as shown in FIG. 8b demonstrates that the reflecting layer 87' can also be formed between the insulating layer 88 and the submount 82 for process flexibility.

Figure 8C:
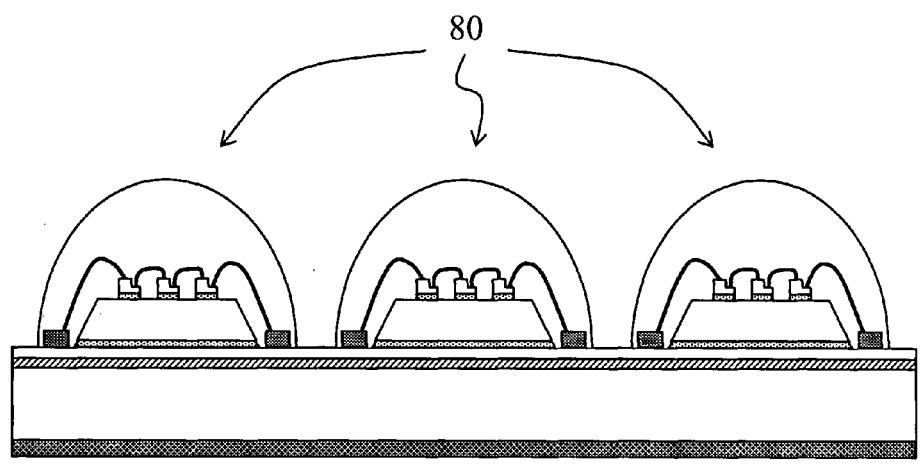

FIG. 8c shows one embodiment of a plurality of the light-emitting elements 80 formed simultaneously on the submount 82 for serving as a direct-type backlight source of a flat display apparatus. The plurality of the light-emitting elements 80 are controlled by the control circuit preformed on the submount 82 or PCB (Printed Circuit board).

Figure 9A:
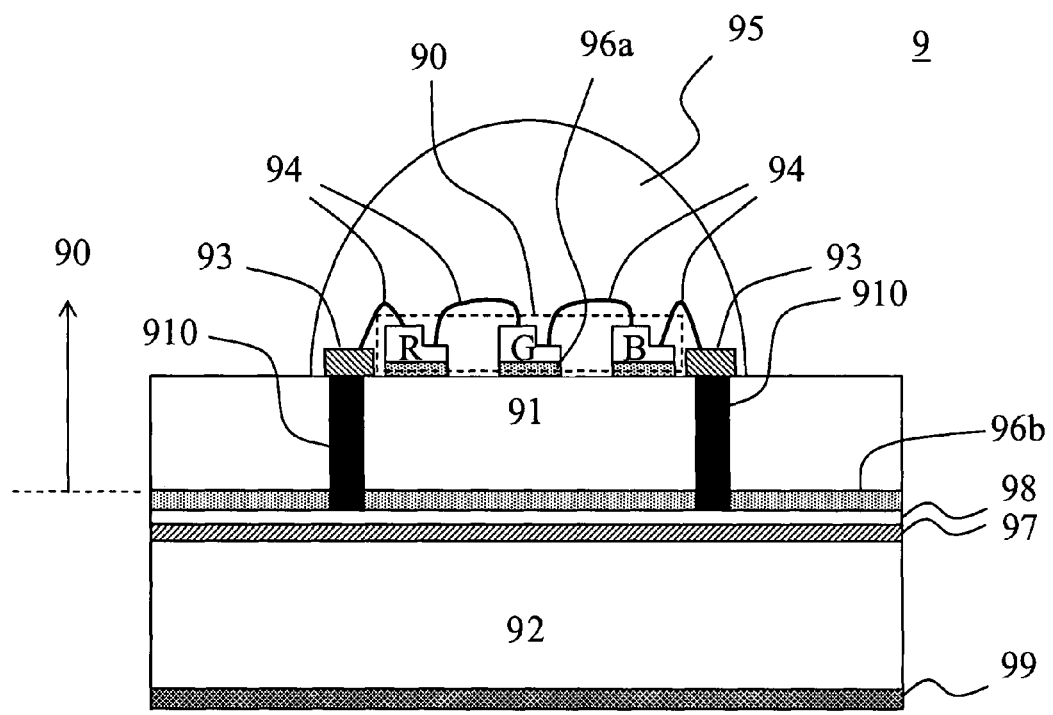
FIGS. 9a and 9b show the light-emitting apparatus comprising a submount in accordance with the present invention.

FIG. 9a shows another embodiment of a light-emitting apparatus comprising a submount in accordance with the present invention. A light-emitting apparatus 9 comprises a light-emitting element 90 and a submount 92 underlying the light-emitting element 90. The light-emitting element 90 comprises a transparent carrier 91, a red LED (R), a green LED (G), and a blue LED (B) formed thereon, bonding pads 83 formed on the transparent carrier 91 for electrically coupling the LEDs to a power supply (not shown) through wires 94, and a resin 95 encapsulating the LEDs, the bonding pads 93, and the wires 94. The R, G, B LEDs are serially connected through wires 94 and attached to the transparent carrier 91 through a first transparent adhesive layer 96a. The submount 92 is selected from the group consisting of Si, $Al_2O_3$, glass, GaP, SiC. Besides, the submount 82 can be made to be flexible or made of intrinsic flexible materials for conforming to the lighting or ornament application with particular shapes. The LEDs can also be connected in a parallel manner as depicted in FIG. 7a. The transparent carrier 91 is further attached to the submount 92 through a second transparent adhesive layer 96b. The light-emitting apparatus 9 further comprises a plurality of heat-conducting channels 910 formed inside the transparent carrier 91 for conducting heat generated from the light-emitting element 90 to the submount 93. Each of the heat-conducting channel 910 comprises a through-hole running through the upper surface to the lower surface of the transparent carrier 91 and a filling material having thermal conductivity greater than 50 [K/m·T] filled in the through-hole. The light-emitting apparatus 9 further comprises a reflecting layer 97 formed on the submount 92 for reflecting light back to the transparent carrier 91. An insulating layer 98, such as $SiN_x$ or $SiO_2$, interposes between the reflecting layer 97 and the transparent carrier 91 for electrically isolating the reflecting layer 97 and the heat-conducting channels 910 in case the reflecting layer 87 is made of conductive materials, such as metal, metal oxide, or the combination thereof. It should be noted that the insulating layer can be omitted from the structure if the reflecting layer is made of dielectric materials, such as DBR (Distributed Bragg Reflector). The light-emitting apparatus 9 further comprises a heat dispersion layer 99 formed on the lower surface of the submount 92 for conducting heat generated from the light-emitting element 90 to the surroundings. The heat dispersion layer 99 comprises materials having thermal conductivity greater than 50 [K/m·T], such as DLC (diamond-like carbon), SiC, or GaN. In order to get a promoted heat dissipation performance, as exemplified, the submount or the heat dispersion layer has a textured or roughened surface to enlarge the heat exchange area to the surroundings.

Figure 9B:
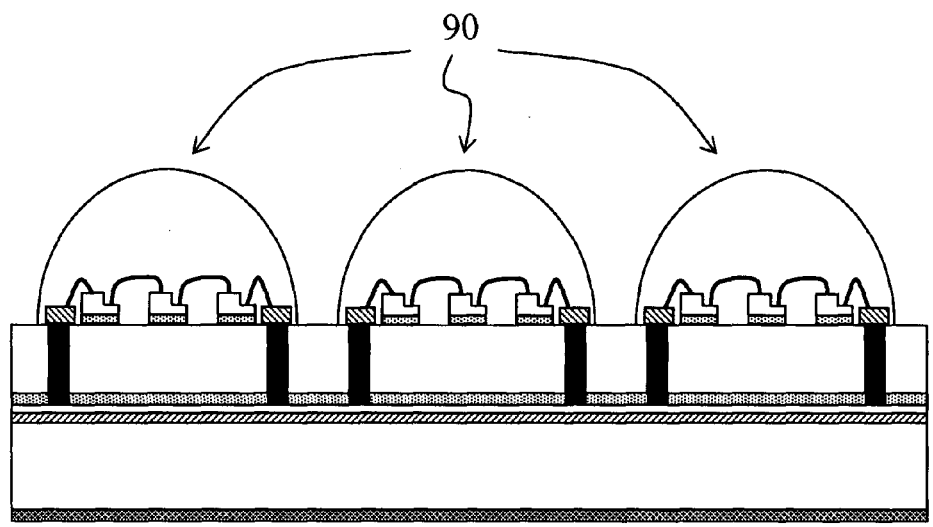

FIG. 9b shows one embodiment of a plurality of the light-emitting elements 90 formed simultaneously on the submount for serving as a direct-type backlight source of a flat display apparatus. The light-emitting elements 90, sharing a common transparent carrier 91, are controlled by the control circuit preformed on the transparent carrier 91 or a PCB (Printed Circuit board). It is also preferred that the light-emitting apparatus described herein further comprises a diffusing plate, a light-guide plate, and a frame unifying the light-emitting apparatus, the diffusing plate, and the light-guide plate to form a backlight module; therefore can be further implemented in a flat display apparatus.

It should be noted that the various preferred embodiments are not for the purpose of limiting the scope of the invention. Any possible changes and modifications may be made thereto without departing from the spirit of the invention, and it is intended to claim all such changes and modifications that fall within the scope of the invention.

What is claimed is:

1. A light-emitting apparatus, comprising:
   a transparent carrier for providing a mixing zone having a top surface and a side surface connecting with the top surface; and
   a plurality of light-emitting diodes (LEDs) commonly formed on the top surface of the transparent carrier, respectively comprising a plurality of light-emitting stack layers and a plurality of transparent substrates formed between the transparent carrier and the light-emitting stack layers;
   wherein the plurality of LEDs are coplanar and separated by trenches on the transparent carrier; and
   wherein the plurality of LEDs emit light beams having at least two distinct colors, and a portion of the light beams having at least two distinct colors are mixed within the mixing zone to form a substantially predetermined color and extracted out of the side surface of the transparent carrier and regions, devoid of the LEDs, of the top surface of the transparent carrier.

2. The light-emitting apparatus according to claim 1, wherein the plurality of LEDs comprise at least two distinct LEDs selected from the group consisting of red, blue, green, and yellow LEDs.

3. The light-emitting apparatus according to claim 1, wherein the substantially predetermined color is white.

4. The light-emitting apparatus according to claim 1, further comprising a transparent adhesive layer for attaching the plurality of LEDs to the transparent carrier.

5. The light-emitting apparatus according to claim 1, wherein the transparent carrier comprises a bottom surface opposite to the top surface, and the light-emitting apparatus further comprises a reflecting layer formed on the bottom surface.

6. The light-emitting apparatus according to claim 1, wherein the transparent carrier and the transparent substrate are selected from the group consisting of $Al_2O_3$, glass, transparent plastics, GaP, SiC, and CVD diamond.

7. The light-emitting apparatus according to claim 1, wherein at least two of the plurality of LEDs are connected in a parallel manner.

8. The light-emitting apparatus according to claim 1, wherein at least two of the plurality of LEDs are serially connected.

9. The light-emitting apparatus of claim 1, further comprising a diffusing plate, a light-guide plate, and a frame for unifying the diffusing plate, and the light-guide plate to form a backlight module.

10. The light-emitting apparatus according to claim 2, wherein the red, green, and green LEDs are in a substantially interlaced arrangement and the total occupation area of the green LEDs is about double that of the red or blue LEDs.

11. The light-emitting apparatus according to claim 2, wherein the total dice number of the green LEDs is about double that of the red or blue LEDS while each of the single die area of the red, green, and blue LEDs is substantially equal.

12. The light-emitting apparatus according to claim 1, wherein the form of the LEDs is a stripe.

13. The light-emitting apparatus according to claim 2, wherein the plurality of coplanar LEDs include red, blue and green light producing LEDs.

14. The light-emitting apparatus according to claim 5, wherein the side ends of the transparent carrier are ramped, curved or ladder shaped.

15. The light-emitting apparatus according to claim 5 wherein the plurality of coplanar LEDs include red, blue and green light producing LEDs which produced light is internally mixed within the transparent carrier to produce white light.

16. The light-emitting apparatus according to claim 1, wherein a plurality of transparent adhesive layers formed between the upper surface of the transparent carrier and each of the LEDs configured to attach the LEDs on the transparent carrier.

17. The light-emitting apparatus according to claim 16, wherein, the LEDs comprise red, green and blue light-emitting LEDs.

18. A light-emitting apparatus, comprising:
a transparent carrier for providing a light-mixing zone having a top surface, a side surface connecting with the top surface, and a bottom surface opposite to the top surface;
a plurality of light-emitting diodes (LEDs) formed on the top surface of the transparent carrier, wherein the LEDs are coplanar;
a transparent adhesive layer between the LEDs and the transparent carrier for attaching the LEDs to the top surface of the transparent carrier; wherein each of the plurality of LEDs comprises electrodes at a side of the LEDs opposite to the transparent adhesive layer;
at least two bonding pads formed on the transparent carrier for electrically connecting the LEDs to a power supply through wires; and
a submount attached to the bottom surface of the transparent carrier;
wherein the plurality of LEDs emit light beams having at least two distinct colors, and a portion of the light beams having at least two distinct colors are mixed within the mixing zone to form a substantially predetermined color and extracted out of the side surface of the transparent carrier and regions, devoid of the LEDs, of the top surface of the transparent carrier.

19. The light-emitting apparatus according to claim 18, wherein the plurality of LEDs comprise at least two distinct LEDs selected from the group consisting of red, blue, green, and yellow LEDs.

20. The light-emitting apparatus according to claim 18, wherein the substantially predetermined color is white.

21. The light-emitting apparatus according to claim 18, further comprising a reflecting layer interposed between the transparent carrier and the submount and formed on the bottom surface of the transparent carrier.

22. The light-emitting apparatus according to claim 18, further comprising a heat dispersion layer formed on a lower surface of the submount.

23. The light-emitting apparatus according to claim 22, wherein the heat dispersion layer comprises materials having thermal conductivity greater than 50 [K/m·T].

24. The light-emitting apparatus according to claim 18, further comprising a plurality of heat-conducting channels running through the top surface of the transparent carrier to the bottom surface of the transparent carrier.

25. The light-emitting apparatus according to claim 18, wherein each of the plurality of LEDs further comprises a transparent substrate.

26. The light-emitting apparatus according to claim 25, wherein the transparent substrate and the transparent carrier are selected from the group consisting of $Al_2O_3$, glass, transparent plastics, GaP, SiC, and CVD diamond.

27. The light-emitting apparatus according to claim 18, wherein at least two of the plurality of LEDs are connected in a parallel manner.

28. The light-emitting apparatus according to claim 18, wherein at least two of the plurality of LEDs are serially connected.

29. The light-emitting apparatus of claim 18, further comprising a diffusing plate, a light-guide plate, and a frame for unifying the diffusing plate, and the light-guide plate to form a backlight module.

30. The light-emitting apparatus according to claim 19, wherein the red, green, and green LEDs are in a substantially interlaced arrangement and the total occupation area of the green LEDs is about double that of the red or blue LEDs and a reflecting layer is formed between an insulating layer and the submount.

31. The light-emitting apparatus according to claim 19, wherein the total dice number of the green LEDs is about double that of the red or blue LEDS while each of the single die area of the red, green, and blue LEDs is substantially equal and a reflecting layer is formed between an insulating layer and the submount.

32. The light-emitting apparatus according to claim 19, wherein the form of the LEDs is a stripe and a reflecting layer is formed between an insulating layer and the submount.

33. The light-emitting apparatus according to claim 22, wherein the heat dispersion layer or the submount has a textured or roughened surface.

34. A light-emitting apparatus, comprising:
a transparent carrier formed on a first portion of a submount for providing a light-mixing zone having a top surface and a side surface connecting with the top surface;
a plurality of light-emitting diodes (LEDs) formed on the top surface of the transparent carrier;
a transparent adhesive layer between the LEDs and the transparent carrier for attaching the transparent carrier to the LEDs; and
at least two bonding pads formed on a second portion of the submount for electrically connecting the LEDs to a power supply through wires;

wherein the plurality of LEDs emit light beams having at least two distinct colors, and a portion of the light beams having at least two distinct colors are mixed within the mixing zone to form a substantially predetermined color and extracted out of the side surface of the transparent carrier and regions, devoid of the LEDs, of the top surface of the transparent carrier.

35. The light-emitting apparatus according to claim 34, wherein the substantially predetermined color is white.

36. The light-emitting apparatus according to claim 34, further comprising a reflecting layer interposed between the transparent carrier and the submount.

37. The light-emitting apparatus according to claim 34, further comprising a heat dispersion layer formed on a bottom surface of the submount.

38. The light-emitting apparatus according to claim 37, wherein the heat dispersion layer comprises diamond-like carbon.

39. The light-emitting apparatus according to claim 34, wherein each of the plurality of LEDs further comprises a transparent substrate.

40. The light-emitting apparatus according to claim 39, wherein the transparent substrate and the transparent carrier are selected from the group consisting of $Al_2O_3$, glass, transparent plastics, GaP, SiC, and CVD diamond.

41. The light-emitting apparatus according to claim 34, wherein at least two of the plurality of LEDs are connected in a parallel manner.

42. The light-emitting apparatus according to claim 34, wherein at least two of the plurality of LEDs are serially connected.

43. The light-emitting apparatus of claim 34, further comprising a diffusing plate, a light-guide plate, and a frame for unifying the diffusing plate, and the light-guide plate to form a backlight module.

44. The light-emitting apparatus according to claim 37, wherein the heat dispersion layer or the submount has a textured or roughened surface.

* * * * *